(12) United States Patent
Lundberg

(10) Patent No.: US 6,870,407 B2
(45) Date of Patent: Mar. 22, 2005

(54) THIN GATE OXIDE OUTPUT DRIVE

(75) Inventor: James R. Lundberg, Austin, TX (US)

(73) Assignee: IP.First, LLC, Fremont, CA (US)

( * ) Notice: Subject to any disclaimer, the term of this patent is extended or adjusted under 35 U.S.C. 154(b) by 67 days.

(21) Appl. No.: 10/317,240

(22) Filed: Dec. 11, 2002

(65) Prior Publication Data
US 2003/0231044 A1 Dec. 18, 2003

Related U.S. Application Data

(60) Provisional application No. 60/390,044, filed on Jun. 18, 2002.

(51) Int. Cl.$^7$ ................................................ H03B 1/00
(52) U.S. Cl. ........................ 327/112; 327/333; 326/81
(58) Field of Search ................................. 327/108, 112, 327/333, 427, 379, 389, 391, 170; 326/68, 81, 83, 87, 80

(56) References Cited

U.S. PATENT DOCUMENTS

| | | | |
|---|---|---|---|
| 5,969,542 A | 10/1999 | Maley et al. | 326/81 |
| 5,995,010 A | 11/1999 | Blake et al. | 326/81 |
| 6,025,737 A | 2/2000 | Patel et al. | 326/68 |
| 6,040,708 A * | 3/2000 | Blake et al. | 326/81 |
| 6,040,729 A | 3/2000 | Sanchez et al. | 327/309 |
| 6,081,132 A * | 6/2000 | Isbara | 326/81 |
| 6,118,302 A | 9/2000 | Turner et al. | 326/68 |
| 6,127,848 A * | 10/2000 | Wert et al. | 326/81 |
| 6,130,557 A * | 10/2000 | Drapkin et al. | 326/81 |
| 6,268,744 B1 | 7/2001 | Drapkin et al. | 326/81 |
| 6,342,794 B1 | 1/2002 | Turner et al. | 326/68 |
| 6,344,758 B1 | 2/2002 | Turner et al. | 326/81 |
| 6,407,579 B1 * | 6/2002 | Goswick | 326/81 |

FOREIGN PATENT DOCUMENTS

| | | |
|---|---|---|
| EP | 0703665 | 9/1995 |
| EP | 1081860 | 8/2000 |
| JP | 08148988 | 7/1996 |

* cited by examiner

Primary Examiner—Long Nguyen
(74) Attorney, Agent, or Firm—Gary R. Stanford; Richard K. Huffman; James W. Huffman

(57) ABSTRACT

An output driver circuit including first and second cascoded scaled P-channel devices coupled to first and second cascoded scaled N-channel devices. The P-channel devices are coupled together at a first node and between an output and a first source voltage having an elevated voltage level. The N-channel devices are coupled between the output and a reference source voltage. The first scaled P-channel device has a gate that receives a pull-up signal and the second scaled P-channel device has a gate coupled to a static voltage. The second P-channel device and the static voltage are configured to protect the first P-channel device from gate oxide breakdown when the first device is turned off. The first N-channel device has a gate receiving a voltage-limited pull-down signal and the second N-channel device has a gate receiving a lower voltage pull-down signal. The cascoded N-channel devices divide load and prevent hot carrier injection effects.

5 Claims, 2 Drawing Sheets

THIN GATE OXIDE OUTPUT DRIVE

This application claims the benefit of U.S. Provisional Application No. 60/390,044 filed on Jun. 18, 2002.

This applications is related to U.S. Non-Provisional patent application Ser. No. 10/317,241, entitled DIGITAL LEVEL SHIFTER FOR MAINTAINING GATE OXIDE INTEGRITY OF SCALED DRIVER DEVICES, having common inventors, common assignee, and filed on the same day as this application. The aforementioned U.S. Non-Provisional Patent Application is herein incorporated by reference for all intents and purposes.

BACKGROUND OF THE INVENTION

1. Field of the Invention

This invention relates to scaled driver devices that are provided to interface external devices operating at elevated voltage levels, and more particularly to a thin oxide output driver including scaled P-channel devices that are not subject to oxide breakdown at elevated voltages, and scaled N-channel devices that are not subject to hot carrier injection effects.

2. Description of the Related Art

As integrated circuit design and fabrication techniques have evolved over the years, the trend is that operating voltages have scaled downward along with device size. Very Large Scale Integrated (VLSI) circuits, particularly microprocessors, tend to lead in the area of size and voltage scaling. As a result, VLSI devices which operate at lower voltages are required to interface to external devices, such as input/output (I/O) devices or the like, that have not been scaled to the same extent as the VLSI devices. Nonetheless, the external devices must be driven to elevated voltage levels much higher than those of the VLSI device cores. As a result, many existing scaled VLSI devices provide voltage conversion circuits to increase the voltage swing of I/O signals so that they can properly interface to the elevated voltage external devices.

In more recent years, VLSI device sizes and operating voltages have decreased to the extent that, in some cases, scaled P-channel devices that provide an interface to elevated voltage external devices experience gate oxide breakdown if those same elevated voltage levels are used to drive their inputs. Because these P-channel devices have been significantly scaled, their gate oxide thickness is so thin that, if their gate is taken to the lowest voltage in the digital voltage range (e.g., 0 volts) while their source is tied to the elevated voltage (e.g., 3.3 volts), then the source-to-gate voltage $V_{SG}$, the channel-to-gate voltage $V_{CG}$, and the drain-to-gate voltage $V_{DG}$, all exceed the breakdown voltage of the gate oxide, referred to as $V_{BROX}$.

For example, VLSI devices today are fabricated using a 0.18 micron process that results in a gate oxide thickness of approximately 40 angstroms (Å) on a typical device. Skilled artisans will appreciate that the breakdown voltage for silicon dioxide (SiO2) is roughly $10^7$ volts per centimeter (V/cm), and they also appreciate that it is prudent to restrict gate voltages to approximately 60 percent of the breakdown value. Hence, a prudent breakdown threshold, $V_{BROX}$, for a 0.18 micron device is approximately 2.4 volts. The 0.18 micron devices are typically operated at VDD=1.8 volts referenced to ground at 0 volts, so that they generate a logic one (1) at 1.8 volts and a logic 0 at 0 volts. Thus, gate oxide breakdown at core voltage levels is not a problem.

The scaled driver devices of a VLSI device are typically required to interface to external Complementary Metal-Oxide Semiconductor (CMOS) devices that operate at higher voltage levels, such as 3.3 volts. As a result, pulling a 0.18 micron P-channel output device up to 3.3 volts, while holding its gate at zero volts will very likely damage the gate oxide of the P-channel device. Output voltage scaling circuits are known that operate to shift a logic 1 at a core voltage level up to the elevated level of the external devices, and to shift a logic 0 from 0 volts up to an intermediate voltage level. The intermediate voltage level is chosen low enough to turn on a P-channel device, yet high enough to avoid breakdown of the gate oxide.

Notwithstanding the protection afforded by output voltage scaling circuits, a conventional scaled output driver circuit experiences related problems when driving elevated voltages on a tri-state bus, such as when the P-channel device is turned off and the bus is pulled low. As further described herein, a portion of the gate oxide that overlaps the drain P-type diffusion area is exposed to excessive voltage, thus causing the oxide in the overlap area to break down.

Another problem occurs in the N-channel portion of the scaled driver device due to hot carrier injection effects. Hot carrier injection effects occur in N-channel device with short channels and thin gate oxide. Under repetitive switching of elevated voltages, the carriers accelerate to the extent that they get trapped in the oxide. This trapped charge can shift the threshold of the device and degrade its performance over time. Although hot carrier effects may be precluded in scaled N-channel devices by lowering the supply voltage, such solution is inapplicable in cases in which the scaled driver devices are required to interface elevated voltages, since the supply voltage cannot be lowered.

Therefore, what is needed is to provide a scaled driver device which is protected from gate oxide breakdown when turned off. It is also desired to protect the scaled driver device from hot carrier injection effects caused by repetitive switching of elevated voltages so that their performance is not degraded over time.

SUMMARY OF THE INVENTION

A scaled output driver according to an embodiment of the present invention includes first and second scaled P-channel devices and an N-channel device. The first scaled P-channel device has a drain and a source coupled between a first node and an elevated source voltage having an elevated voltage level. The first scaled P-channel device has a gate that receives a pull-up signal that turns the first scaled P-channel device off when driven towards the elevated voltage level. The second scaled P-channel device has a drain and a source coupled between the first node and an output node and has a gate coupled to a static source voltage. The static source voltage has a voltage level that prevents gate oxide breakdown of the first scaled P-channel device when the first scaled P-channel device is turned off. The N-channel device is coupled between the output node and a reference source voltage.

An output driver circuit according to an embodiment of the present invention includes first and second cascoded scaled P-channel devices coupled to first and second cascoded scaled N-channel devices. The P-channel devices are coupled together at a first node and between a first source voltage and an output. The first source voltage has an elevated voltage level. The N-channel devices are coupled between the output and a reference source voltage. In this configuration, the first scaled P-channel device has a gate that receives a pull-up signal and the second scaled P-channel device has a gate coupled to a static voltage. The N-channel devices each have gates receiving a respective one of first and second pull-down signals.

An integrated circuit (IC) according to an embodiment of the present invention includes core circuitry, a digital level shifter and a scaled driver device. The core circuitry generates a first pull-up signal and a first pull-down signal each operable within a lower voltage range defined between a first source voltage and a reference source voltage. The digital level shifter receives the first pull-up and pull-down signals and provides second pull-up and pull-down signals indicative thereof, respectively. The second pull-up and pull-down signals are operable within an elevated voltage range between a second source voltage and the reference source voltage. The scaled driver device includes first and second cascoded scaled P-channel devices coupled together at a first node and between the first source voltage and an output. The scaled driver device includes an N-channel device coupled between the output and a reference voltage. The first scaled P-channel device has a gate receiving the second pull-up signal. The second scaled P-channel device has a gate coupled to a static voltage having a voltage level that protects the first scaled P-channel device from gate oxide breakdown.

The N-channel device may include first and second cascoded scaled N-channel devices coupled between the output and reference source voltages. The first scaled N-channel device has a gate that receives the second pull-down signal. The second scaled N-channel device has a gate that receives the first pull-down signal.

Other features, benefits and advantages of the present invention will become apparent upon study of the remaining portions of the specification and drawings.

BRIEF DESCRIPTION OF THE DRAWINGS

These and other objects, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The inventor of the present application has recognized the need for using scaled driver devices that are required to output elevated voltages, such as for driving tri-state buses and the like, but that cannot tolerate elevated voltages levels applied across overlapping gate portions of the device when turned off. The inventor has further recognized the need to avoid hot carrier injection effects in scaled N-channel driver devices under repetitive switching of elevated voltages. He has therefore developed a scaled driver device including a pull-up portion that is not subject to gate oxide breakdown at elevated voltage levels when turned off, and including a pull-down portion that is not subject to hot carrier injection effects during repetitive switching of elevated voltages, as will be further described below with respect to FIGS. 1–4.

Figure 1:
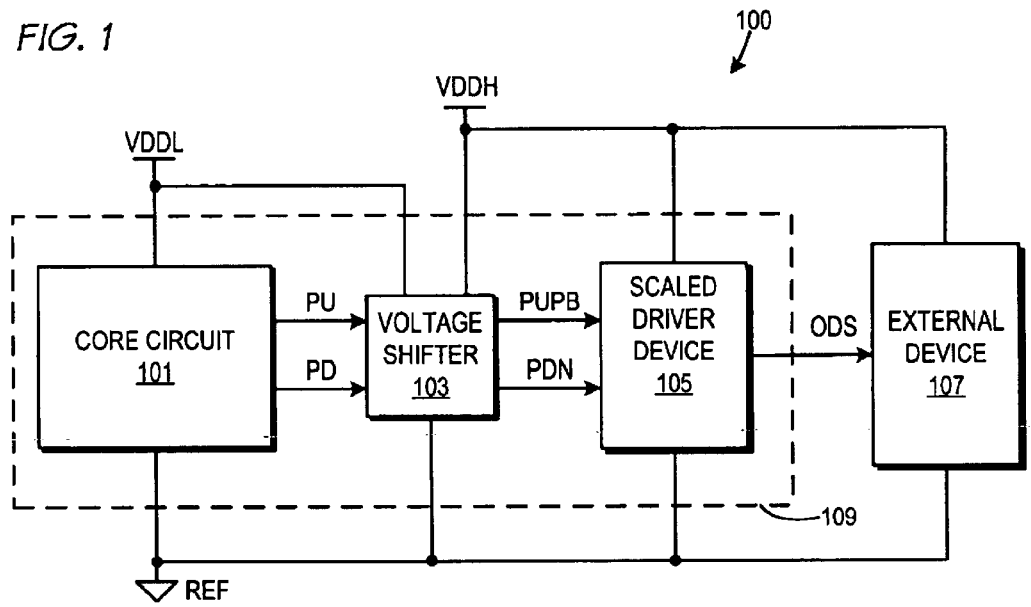
FIG. 1 is a simplified block diagram of a system including a core circuit, a voltage shifter circuit, a scaled driver device implemented according to an embodiment of the present invention, and an external device 107.

FIG. 1 is a simplified block diagram of a system 100 including a core circuit 101, a voltage shifter circuit 103, a scaled driver device 105, and an "external" device 107. The core circuit 101 receives power via a first source voltage VDDL, having a voltage level or magnitude referenced with respect to a common or reference source voltage REF, which is also provided to the core circuit 101. A power or voltage source (not shown) generates a source voltage between VDDL and REF. VDDL and REF collectively define a first or lower voltage range (VDDL-REF) suitable for providing power to devices within the core circuit 101. The core circuit 101 generates one or more logical or digital signals provided to respective inputs of one or more voltage shifter circuits 103. The term "digital" as used herein refers to devices that operate in a similar manner as a switch having multiple discrete operating points associated with different logic states and/or different voltage levels.

In the embodiment shown, the core circuit 101 asserts a pull-up signal PU and a pull-down signal PD, which signals are provided to respective inputs of the voltage shifter circuit 103. The PU and PD signals are intended to drive the state of an external tri-state bus or the like to one of three states, including a high logic state upon assertion of the PU signal, a low logic state upon assertion of the PD signal, or a tri-state condition when neither of the PU or PD signals are asserted. The PU and PD signals each have a first logic state at or near the voltage level of REF and a second logic state at or near the voltage level of VDDL. The logic states are typically referred to as logic one or "1" and logic zero or "0". Positive or negative logic is contemplated, so that either of the logic 1 and 0 states may be correspond to either REF or VDDL. The voltage shifter circuit 103 is coupled to VDDL and REF for providing power to internal digital circuitry, further described below, to enable detection of the logic states of the PU and PD signals.

The voltage shifter circuit 103 asserts a pair of logical or digital signals PUPB and PDN to respective inputs of the scaled driver device 105. The PUPB signal is intended to reflect the logic state of the PU signal and the PDN signal is intended to reflect the logic state of the PD signal. It is noted that a "B" appended to a signal name or Input/Output (I/O) pin herein denotes logical negation in which the inverted, or complementary, signal or I/O pin has the opposite logic state. The PUPB signal, for example, is the logical complementary signal of a signal PUP (not shown), which would otherwise have the same logic state as the PU signal. Since the PUPB signal controls P-channel devices, it may be configured to have the opposite logic state as the PU signal.

The scaled driver device 105 is coupled between a second source voltage VDDH and REF, which collectively define a second or elevated voltage range VDDH-REF). Another power or voltage source (not shown) generates a source voltage between VDDH and REF. The magnitude of VDDH is greater than the magnitude of VDDL, so that the second voltage range associated with VDDH is larger than the first voltage range associated with VDDL. The source voltages VDDL and VDDH are typically both positive, although the present invention contemplates the use of negative source voltages. The scaled driver device 105 generates an output logical or digital signal ODS to the external device 107, which is also coupled to VDDH and REF.

The ODS signal is operative in the second, elevated voltage range having first and second logic states 0 and 1 with respective voltage levels within the voltage levels of VDDH and REF. Either of the logic 1 and 0 states may correspond to either REF or and VDDH, since positive or negative logic is contemplated. The external device 107 is "external" relative to the core circuit 101 and the external device 107 may be any type of input/output (I/O) device intended to be interfaced to the core circuit 101. The ODS signal also has a tri-state condition when it is not asserted to either of the logic 0 or 1 states. For example, if the PUPB is pulled high while the PDN signal is pulled low, then the scaled driver device 105 tri-states its output so that it does not drive the ODS signal to either logic state 0 or 1. The external device 107, however, may include other drivers or the like (e.g., a bus driver, not shown), where any given driver might otherwise drive the ODS signal to either logic state 0 or 1 when the scaled driver device 105 tri-states its output. In this manner, the devices within the scaled driver device 105 may be exposed to elevated voltage levels under several conditions, such as when the scaled driver device 105 tristates its output and the ODS signal is driven low by an external device.

In operation, it is desired that the logic information of the PU and PD signals asserted by the core circuit 101 be conveyed to the external device 107 via the ODS signal. The PU and PD signals are converted to the PUPB and PDN signals, respectively, by the voltage shifter circuit 103. The scaled driver device 105 conveys the logic information of the PUPB and PDN signals to the ODS signal. The external device 107 is designed to operate with logic signals having voltage levels defined within the second, elevated voltage range VDDH-REF, which is greater than the first, lower voltage range VDDL-REF. In this manner, the external device 107 must be driven to voltage levels higher than the PU and PD signals to facilitate logic switching. VDDH is provided to the level shifter circuit 103 and the scaled driver device 105 to enable both circuits to operate within the elevated voltage range. The scaled driver device 105 switches the ODS signal in the full elevated range needed to drive the input of the external device 107 in response to switching of the PUPB and PDN signals.

The PUPB signal operates within a voltage-shifted range based on the voltage level of VDDH and suitable to drive an input of the scaled driver device 105. The voltage-shifted range does not extend within the full voltage range of the elevated voltage range, so that the PUPB signal is a voltage-shifted digital signal. In particular, the voltage shifter circuit 103 operates to switch the PUPB signal within a voltage-shifted range between an intermediate voltage level (INT) and the voltage level of VDDH. The INT voltage level has a magnitude greater than the magnitude of REF and is selected so that the voltage shifted range VDDH-INT does not exceed the breakdown voltage of the scaled P-channel devices within the scaled driver device 105. More specifically, the ODS signal is driven to the voltage level of VDDH when the PUPB signal is driven to the INT voltage level without the risk of causing gate oxide breakdown of the P-channel devices of the scaled driver device 105 when turned on.

Several embodiments are contemplated for the PDN signal. In general, the PDN signal is provided to at least one N-channel device within the scaled driver device 105, which operates as a pull-down device. In one embodiment, the ODS signal is pulled low when the PDN signal is pulled high and the ODS signal is either tri-stated or pulled high depending upon the state of the PUPB signal when the PDN signal is pulled low. The PDN signal may be operated in the full elevated voltage range VDDH-REF. As described further below, the PDN signal may include multiple signals or may be combined with another signal to operate the one or more N-channel devices in such a manner to reduce or otherwise eliminate hot carrier injection effects. This is particularly advantageous for scaled N-channel devices having short channels and thin gate oxide.

In one embodiment, the voltage shifter circuit 103 is implemented in accordance with a related disclosure, entitled DIGITAL LEVEL SHIFTER FOR MAINTAINING GATE OXIDE INTEGRITY OF SCALED DRIVER DEVICES, U.S. Non-Provisional patent application Ser. No. 10/317,241, having common inventors, a common assignee, flied on the same day as this application, and which is hereby incorporated herein in its entirety. The digital level shifter described in the incorporated disclosure operates to raise the level of a logic 0 for an input to an elevated voltage output driver. Several benefits are achieved using the digital level shifter described in the related disclosure. First, the digital level shifter is implemented entirely with digital devices and may be completely incorporated onto the same integrated circuit (IC) as the core circuit 101 using the same processing methods, as further described below. Second, the digital level shifter provides several signals operative in selected voltage ranges that collectively perform the functions of the PUPB and PDN signals, as further described below.

It is noted, however, that the voltage shifter circuit 103 may be implemented in accordance with any suitable voltage shifter circuit. For example, the voltage shifter circuit 103 may be implemented according to conventional voltage shifting circuits employing analog and digital circuitry. In this case, the analog circuitry would be employed to create a logic voltage bias for the digital circuits. Analog devices, however, are large and require a great deal of power and ill-suited for VLSI device applications, and thus would be implemented separately and/or externally.

As described previously, integrated circuit (IC) design and fabrication techniques have evolved such that operating voltages have scaled downward along with device size. The core circuit 101, for example, may be a VLSI device integrated into an IC, where it is desired that the IC directly interface the external device 107. In one embodiment, the voltage shifter circuit 103 is implemented as the digital shifter circuit described in the above incorporated U.S. Non-Provisional Patent Application, both the digital shifter circuit 103 and the scaled driver device 105 are integrated into the same IC as the core circuit 101, as indicated by dashed line 109. Furthermore, the core circuit 101, the level shifter circuit 103, and the scaled driver device 105 are implemented using the same circuit scaling techniques in which their constituent N-channel and P-channel devices have a relatively thin gate oxide thickness. In this manner, the IC 109 includes several external source pins or terminals for coupling to respective source voltages as shown.

It is noted that the present invention is not limited to embodiments in which the voltage shifter circuit 103 and scaled driver device 105 are implemented with the same process and/or on the same IC as the core circuit 101. Each circuit may be implemented separately without departing from the spirit and scope of the present invention. The voltage shifter circuit 103, for example, if implemented in a conventional manner, might not be implemented on the IC 109 or would at least include analog portions not provided on the IC 109. The ability to design and manufacture these circuits entirely on the same IC using similar fabrication techniques, however, provides significant advantages as appreciated by those skilled in the art.

In a more specific embodiment, the IC 109 is a VLSI device fabricated using a 0.18 micron process including metal-oxide semiconductor (MOS) devices which have a gate oxide thickness of approximately 40 Å. The core circuit 101 may be, for example, a microprocessor in which it is desired to maximize size and voltage scaling. As previously noted, the gate oxide breakdown threshold, $V_{BROX}$, for these devices is approximately 2.4 volts. VDDL is typically 1.8 volts relative to REF, which is typically zero volts or ground. Since the maximum voltage levels applied to the core circuit 101 are well below the threshold breakdown limit, oxide breakdown is not a concern.

In the specific embodiment, the external device 107 includes 3.3-volt CMOS devices, so that VDDH is approximately 3.3 volts while REF is 0 volts. Also, the scaled driver device 105 includes 0.18 micron P-channel and N-channel devices that are required to interface the 3.3-volt external device 107. The voltage shifter circuit 103 operates the PUPB signal between approximately 1.0 volt and approximately 3.3 volts, where INT is approximately 1.0 volt. In this specific embodiment, the voltage shifted range is approximately 2.3 volts since the gates of the P-channel devices of the scaled driver device 105 integrated on the IC 109 do not drop below approximately 1.0 volt. Since 2.3 volts is less than $V_{BROX}$ of approximately 2.4 volts, there is little risk of breaking down the gate oxide of the scaled P-channel devices when turned on. As described further below, the scaled driver device 105 is configured to prevent a similar gate-oxide breakdown condition when turned off and when the ODS signal is pulled to 0 volts.

Figure 2:
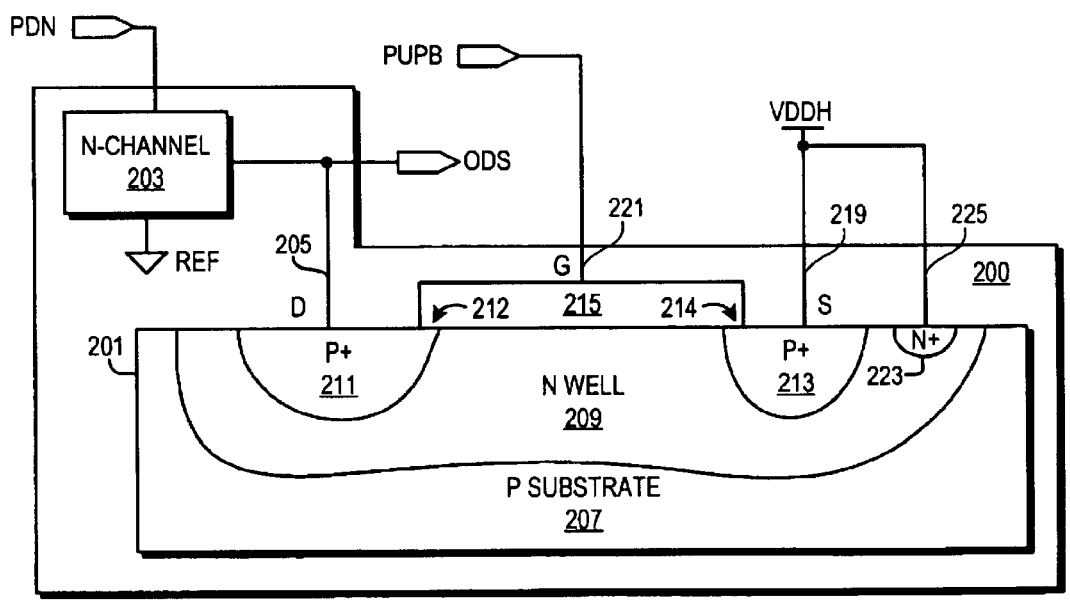
FIG. 2 is a more detailed figurative diagram of a conventional scaled driver device implemented according to prior art.

FIG. 2 is a more detailed figurative diagram of a conventional scaled driver device 200 implemented according to prior art. The conventional scaled driver device 200 is shown to illustrate the gate-oxide breakdown problems if used as the scaled driver device 105 of FIG. 1. The scaled driver device 200 includes a P-channel device 201 coupled to a corresponding N-channel device 203 at a drain terminal 205 of the P-channel device 201. The drain 205 develops the signal ODS. The P-channel device 201 includes a P-type substrate 207, an N-type well region (N-well) 209, and a pair of P-type diffusion regions (P+) 211 and 213. A gate insulator layer 215 is provided on the N-well region 209 and overlaps the P-type regions 211 and 213 as shown at overlap areas 212 and 214, respectively. The drain terminal 205 and a source terminal 219 are connected to the P-type regions 211 and 213, respectively, and a gate terminal 221 is connected to the gate insulator layer 215. An N-type region (N+) 223 is provided on the N-well region 209 and an N-well terminal 225 is connected to the N-well region 223. VDDH is coupled to the source terminal 219 and to the N-well terminal 225. The PUPB signal is provided to the gate terminal 221 and the PDN signal is provided to the N-channel device 203. The PUPB and PDN signals collectively control the conventional scaled driver device 200 to drive the ODS signal into one of the three states or conditions as defined for tri-state devices.

As described above, the PUPB signal is provided from the voltage shifter circuit 103 and is maintained within the voltage shifted range VDDH-INT. The voltage shifted range precludes the turn-on voltage provided to the gate terminal 221 from dropping to a level that would damage the gate oxide of the gate layer 215 due to excessive source-to-gate or channel-to-gate voltages. The drain terminal 205, however, can be driven down to the REF voltage level by any device coupled thereto (e.g., the external device 107 or any other bused device not shown) or even by the N-channel device 203. When the PUPB signal is asserted to the elevated voltage level VDDH turning the P-channel device 201 off at the same time that the drain terminal 205 is pulled to the REF voltage level, then the overlap area 212 experiences the elevated voltage level VDDH-REF. The elevated voltage level causes the oxide in the overlap area 212 to break down, even though most of the gate oxide of the gate layer 215 only sees the voltage level of the N-well 209, which is at the same voltage level (VDDH) as the gate terminal 221.

Figure 3:
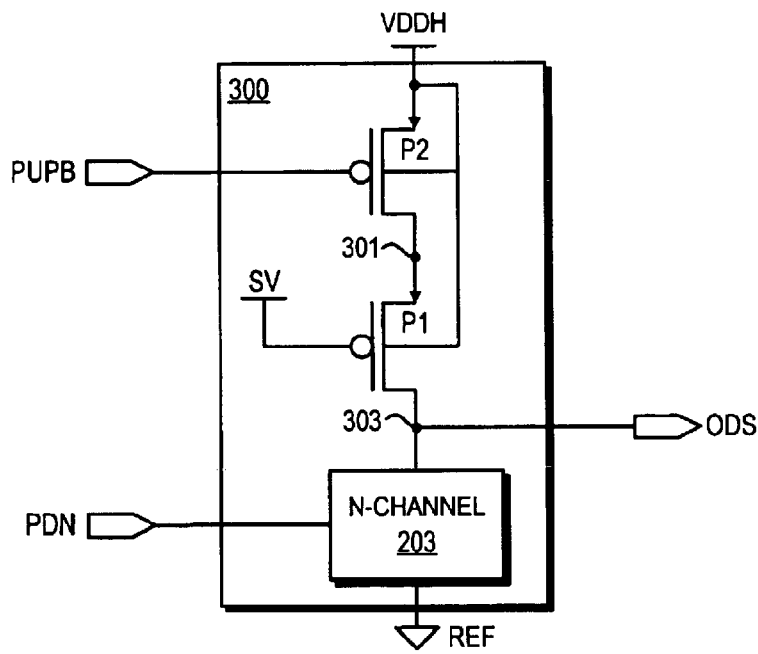
FIG. 3 is a schematic diagram of an exemplary embodiment of a scaled driver device implemented according to the present invention.

FIG. 3 is a schematic diagram of an exemplary embodiment of a scaled driver device 300 implemented according to the present invention. The scaled driver device 300 may be used as the scaled driver device 105 of FIG. 1 to prevent gate-oxide breakdown. The PUPB signal is provided to the gate of a first P-channel device P2. The source of P2 is coupled to VDDH and the drain of P2 is coupled to a node 301, which is also coupled to the source of a second P-channel device P1. The N-wells of both of the P-channel devices P1 and P2 are coupled to VDDH. The gate of P1 is coupled to a static voltage (SV) and the drain of P1 is coupled to the N-channel device 203 at an intermediate node 303 that develops the ODS signal. The N-channel device 203 receives and is controlled by the PDN signal.

As shown, P1 is coupled to P2 at the node 301 in a cascoded configuration, where P1 has its gate tied to SV having a static voltage level. The static voltage level of SV is selected to be an appropriate voltage level so that P1 is on when its drain is pulled down to 0 volts, such as by the external device 107, or, possibly, by the N-channel device 203. P1 begins to turn off when the voltage at its source drops and approaches a protective voltage level (PVL) defined as the sum of the static voltage level (SV) and a threshold level (TL), e.g., PVL=SV+TL. The cascoded P1–P2 circuit configuration operates as a pull-up device to drive the ODS signal high when the PUPB signal is pulled low and protects the outputs of both P1 and P2 from experiencing excessive gate oxide voltages. For a 0.18 micron process device in which VDDH is approximately 3.3 volts and REF is approximately 0 volts, SV is selected to have a static voltage level of approximately 1.0 volt.

When the PUPB signal is pulled high turning off P2, P1 is on. When the ODS signal is pulled low, such as down to the REF voltage level (e.g., 0 volts), the node 301 (drain of P2 and source of P1) discharges only down to the protective voltage level PVL. For a 0.18 micron process in which SV is approximately 1.0 volt and REF is approximately 0 volts, the threshold level TL is approximately 0.5 volts so that the node 301 is pulled down to approximately 1.5 volts. The node 301 discharges only to PVL because the gate of P1 is held at the voltage level of the SV signal, so that P1 begins to turn off when its source reaches PVL. The cascoded configuration of P1 and P2 protects P2 when P1 is turned off. The source of P2 is tied to the elevated source voltage VDDH and the gate of P2 is also at VDDH when turned off. The drain of P2 (node 301), however, only drops to the protective voltage level PVL when turned off. In this manner, it is appreciated that SV is selected to prevent gate oxide breakdown of P2 when turned off. P1 is also protected from excessive oxide voltages because P1 only experiences a gate-to-drain voltage, referred to as $V_{GD}$, of SV-REF, which is approximately 1 volt for the 0.18 micron process when SV is approximately 1 volt and REF is approximately 0 volts.

Figure 4:
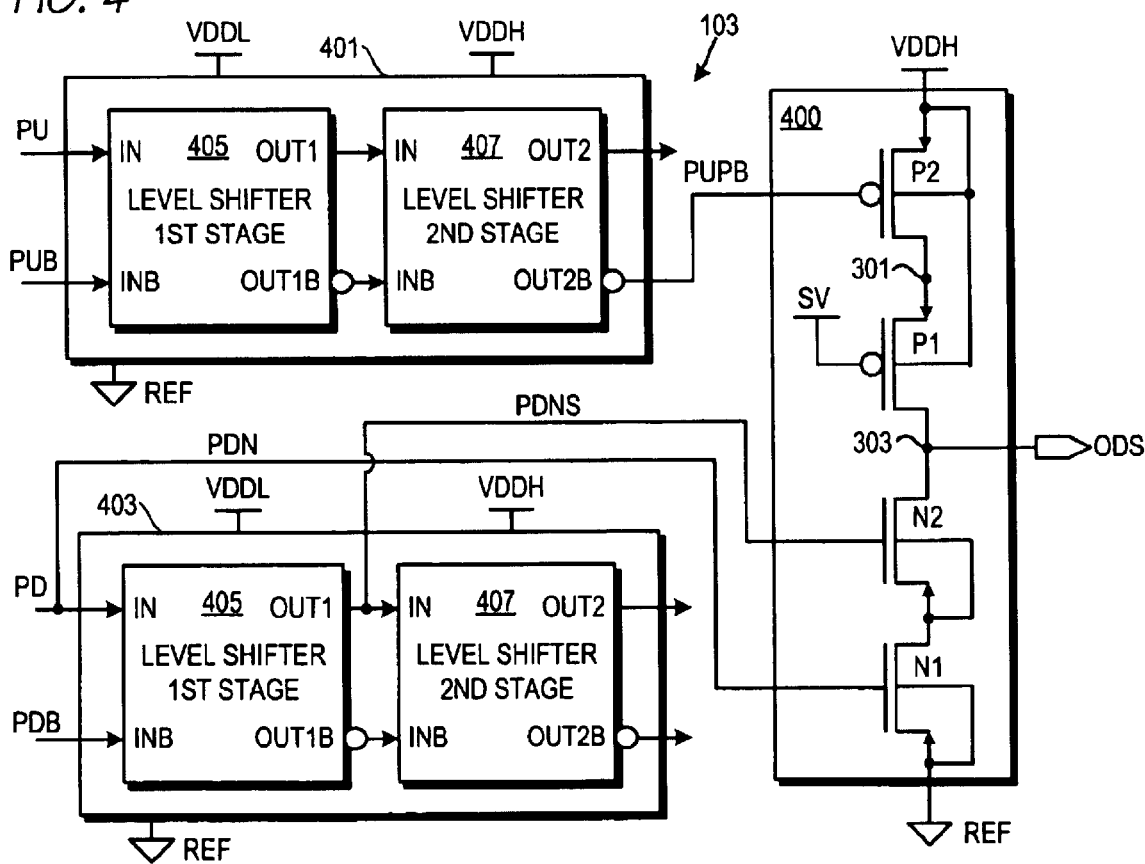
FIG. 4 is a schematic diagram of another scaled driver device implemented according to an alternative embodiment the present invention coupled to an exemplary embodiment of the voltage shifter circuit of FIG. 1.

FIG. 4 is a schematic diagram of another scaled driver device 400 implemented according to an alternative embodiment the present invention coupled to an exemplary embodiment of the voltage shifter circuit 103. The scaled driver device 400 may instead be used as the scaled driver device 105 of FIG. 1 to prevent gate-oxide breakdown and to further prevent hot carrier injection effects. Similar components as used in the scaled driver device 300 assume identical reference designators. The voltage shifter circuit 103 includes a pair of digital level shifter circuits 401 and 403, each implemented according to the above incorporated U.S. Non-Provisional Patent Application. Each of the digital level shifter circuits 401 and 403 are referenced to VDDL, VDDH, and REF and include a first stage 405 and a second stage 407. For each digital level shifter circuit 401 and 403, the first stage 405 has a complementary pair of inputs IN and INB that receive a corresponding complementary pair of input signals having logic states with voltage levels within VDDL and REF. The first stage 405 switches a corresponding pair of digital output signals at complementary outputs OUT1 and OUT1B between VDDL and an intermediate voltage level, such as INT, in response to switching of the input signals. The output signals at the outputs OUT1 and OUT1B of the first stage 405 are provided to corresponding inputs IN and INB, respectively, of the second stage 407. The complementary outputs OUT2 and OUT2B of the second stage 407 are each switched between VDDH and the intermediate voltage level INT in response to switching of the input signals.

As shown, the first stage 405 of the digital level shifter circuit 401 receives a complementary signal pair PU and provides the PUBP signal at the OUT2B output of the corresponding second stage 407. It is noted that positive or negative logic is contemplated. For positive logic, the PU signal pair includes the PU signal provided to the input IN and a complementary signal PUB provided to the input INB of the first stage 405. The first stage 405 of the digital level shifter circuit 403 receives the complementary signal pair PD, in which the signal pair PD is similar to the signal pair PU, such as including the PD signal and a complementary signal PDB. The PU signal provided to the input IN is used as the signal PDN, which switches between the VDDL and REF levels. The output OUT1 of the first stage develops a signal PDNS, which is a voltage-limited or voltage-shifted version of the PDN signal. In particular, the PDNS signal switches between the VDDL and INT levels in response to switching of the PDN signal. The second stage 40 is configured to switch its outputs in response to switching of the voltage-limited outputs of the first stage 405.

The scaled driver device 400 includes the P-channel devices P1 and P2 coupled together at node 301 in substantially identical manner as P1 and P2 of the scaled driver device 300 and coupled between VDDH and node 303, where node 303 develops the ODS signal. The N-channel device 203 is replaced by N-channel devices N1 and N2 coupled in a cascoded configuration. The N-channel device N2 has a drain coupled to node 303, a source coupled to a drain of the N-channel device N1 and a gate that receives the PDNS signal N1 has a source coupled to REF and a gate that receives the PDN signal. The N-wells of N1 and N2 are each coupled to their respective sources, so that the N-well of N1 is coupled to REF and the N-well of N2 is coupled to the drain of N1.

The cascoded N-channel devices N1 and N2 collectively form a pull-down stage for the scaled driver device 400. In one embodiment, N1 and N2 are scaled devices with relatively short channels and thin gate oxide. The cascoded device N2 precludes hot carrier injection effects on N1 due to switching at elevated voltage levels. As described previously, hot carrier effects occur typically in N-channel devices that have a very short channel and a thin gate oxide. Under repetitive switching of elevated voltages, the carriers accelerate to the extent that they get trapped in the oxide. This trapped charge can shift the threshold of the device, and degrade performance over time. In the cascoded configuration, the gate of N2 logically follows the gate of N1 since the PDNS signal driving the gate of N2 follows the signal PDN driving the gate of N1. In the embodiment shown, the lower bound of the voltage-limited PDNS signal driving the gate of N2 is approximately the intermediate voltage level INT rather than the REF voltage level. N2 protects N1 because the N2 and N1 devices collectively act as a resistor divider during a transient switching of the ODS signal from the elevated voltage VDDH to the REF voltage level, which precludes hot carrier effects in N1. The elevated voltage load is divided between N1 and N2.

The PDNS signal driving the gate voltage of N2 is dropped to the intermediate voltage level INT when the PDN signal is pulled to REF turning N1 off, which protects N2 from bus transients on the ODS signal. The voltage on the ODS signal may drop below the REF level due to transmission line effects. For instance, with an otherwise VDDL voltage level on the gate of N2 when N1 is turned off, if a transient pulls the drain of N2 at node 303 below the REF voltage level, then N2 would experience a gate-to-channel voltage that could be excessive. Instead, the gate voltage on N2 is lowered to the INT voltage level when N1 is turned off to preclude excessive gate-to-channel voltages from occurring due to bus transients.

It is noted that although 0.18 micron parts and associated voltage levels are referenced herein to illustrate the invented solution to problems associated with driver device scaling, the same solution equally applies to both larger and smaller devices. This is because the phenomena of gate oxide breakdown is not only a function of a device's fabrication process, but is also a function of the device's application, i.e., the voltage requirements of parts to which a fabricated device is required to interface. Accordingly, the present invention is not limited to 0.18 micron parts and associated voltage levels but instead is applicable to any technology in which scaling has been applied. Also, the source voltage signals may have different voltage levels and polarities defining any practicable voltage range for a given fabrication process. REF, for example, may be shifted to a voltage level other than zero, where the remaining source voltages are shifted accordingly to define desired or otherwise appropriate voltage ranges. The breakdown threshold is determined according to the fabrication process, application, and relative voltage levels to maintain gate oxide integrity of scaled driver devices.

Although the present invention has been described in considerable detail with reference to certain preferred versions thereof, other versions and variations are possible and contemplated. For example, particular voltage levels and/or voltage ranges may be different depending upon the types of devices or fabrication processes. The associated voltage levels of 0.18 micron devices are illustrated in exemplary embodiments, where it is understood that the present invention applies to both smaller and larger devices associated with the same or different voltage levels. Positive or negative logic is contemplated. The P-channel and N-channel devices may be implemented as PMOS and NMOS devices, respectively, such as PMOS and NMOS transistors as known to those skilled in the art.

Moreover, the phenomena of gate oxide breakdown typically associated with MOS-type devices is not only a function of the device's fabrication process, but is also a function of the device's application, including the voltage requirements of external devices to which the fabricated device is required to interface.

Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

What is claimed is:

1. An integrated circuit (IC), comprising:
   core circuitry, coupled to a reference voltage and a first source voltage, that generates a first pull-up signal and a first pull-down signal each operable within a lower voltage range defined by said reference and first source voltages;
   a digital level shifter, coupled to said reference and first source voltages and to a second source voltage, said second source voltage being greater than said first source voltage, said digital level shifter receiving said first pull-up signal and providing a second pull-up signal indicative thereof, and receiving said first pull-down signal and providing a second pull-down signal indicative thereof, wherein said second pull-up and pull-down signals are operable between said reference and second source voltages; and
   a scaled driver device, comprising:
      first and second cascoded scaled P-channel devices coupled together at a first node and between said first source voltage and an output; and
      an N-channel device coupled between said output and said reference voltage;
      wherein said first scaled P-channel device has a gate receiving said second pull-up signal, and wherein said second scaled P-channel device has a gate coupled to a static voltage having a voltage level that protects said first scaled P-channel device from gate oxide breakdown.

2. The IC of claim 1, wherein said N-channel device comprises:
   first and second cascoded scaled N-channel devices coupled between said output and reference source voltages; and
   wherein said first scaled N-channel device has a gate that receives said second pull-down signal and wherein said second scaled N-channel device has a gate that receives said first pull-down signal.

3. The IC of claim 2, wherein said digital level shifter comprises:
   a first digital level shifter, coupled to said reference, first and second source voltages, that receives said first pull-up signal and that provides a second pull-up signal indicative of said first pull-up signal, wherein said second pull-up signal is operable between said second source voltage and an intermediate voltage, said intermediate voltage being between said reference and first source voltages, and
   a second digital level shifter, coupled to said reference and first source voltages, that receives said first pull-down signal and that provides said second pull-down signal operable between said first source and intermediate voltages.

4. The IC of claim 3, wherein said core circuitry, said first and second digital level shifters, and said scaled driver device are each fabricated using 0.18 micron devices having a gate oxide thickness of approximately 40 angstroms.

5. The IC of claim 4, wherein said first source voltage is approximately 1.8 volts, wherein said reference voltage is approximately 0 volts, wherein said second source voltage is approximately 3.3 volts, wherein said intermediate voltage is approximately 1 volt, and wherein said static voltage is approximately 1 volt.

* * * * *